(12) United States Patent
Maciver et al.

(10) Patent No.: US 8,090,976 B2
(45) Date of Patent: Jan. 3, 2012

(54) ERROR CORRECTION FOR DIGITAL SYSTEMS

(75) Inventors: Mark Alasdair Maciver, Bridge of Weir (GB); James Keith MacKenzie, Largs (GB)

(73) Assignee: International Business Machines Corporation, Armonk, NY (US)

( * ) Notice: Subject to any disclaimer, the term of this patent is extended or adjusted under 35 U.S.C. 154(b) by 1089 days.

(21) Appl. No.: 11/771,243

(22) Filed: Jun. 29, 2007

(65) Prior Publication Data

US 2008/0022193 A1 Jan. 24, 2008

(30) Foreign Application Priority Data

Jun. 29, 2006 (GB) .................................. 0612892.0

(51) Int. Cl.
*G06F 11/20* (2006.01)
(52) U.S. Cl. ........................... 714/4.11; 714/43; 714/708
(58) Field of Classification Search ................ 714/7, 43, 714/708, 4.11
See application file for complete search history.

(56) References Cited

U.S. PATENT DOCUMENTS

| | | | |
|---|---|---|---|
| 7,362,697 B2* | 4/2008 | Becker et al. ................. | 370/217 |
| 7,712,010 B2* | 5/2010 | Dell .............................. | 714/777 |
| 2008/0005644 A1* | 1/2008 | Dell .............................. | 714/766 |
| 2009/0119423 A1* | 5/2009 | Matsuzaki et al. .............. | 710/35 |

OTHER PUBLICATIONS

"Reliable Logic Circuits with Byte Error Control Codes—A Feasibility Study" Jien-Chung Lo. Publication No. 1063-6722/96 1996 IEEE.

* cited by examiner

*Primary Examiner* — Stephen Baker
(74) *Attorney, Agent, or Firm* — Michael J. LeStrange

(57) ABSTRACT

An interface system is provided between a source component (210) and a destination component (220) having multiple parallel lines for transmitting data or parity bits (231-234, 251-253) and one or more spare lines (241-243). An error detection means (222) identifies one or more faulty lines. A mapping means (228) re-routes data or parity from a faulty line to a spare line. A communication link (208) is provided for communicating the re-routing between the source component (210) and the destination component (220). The error detection and mapping can be repeated to detect and re-route sequential multiple-bit line errors using additional spare lines (241-243).

15 Claims, 7 Drawing Sheets

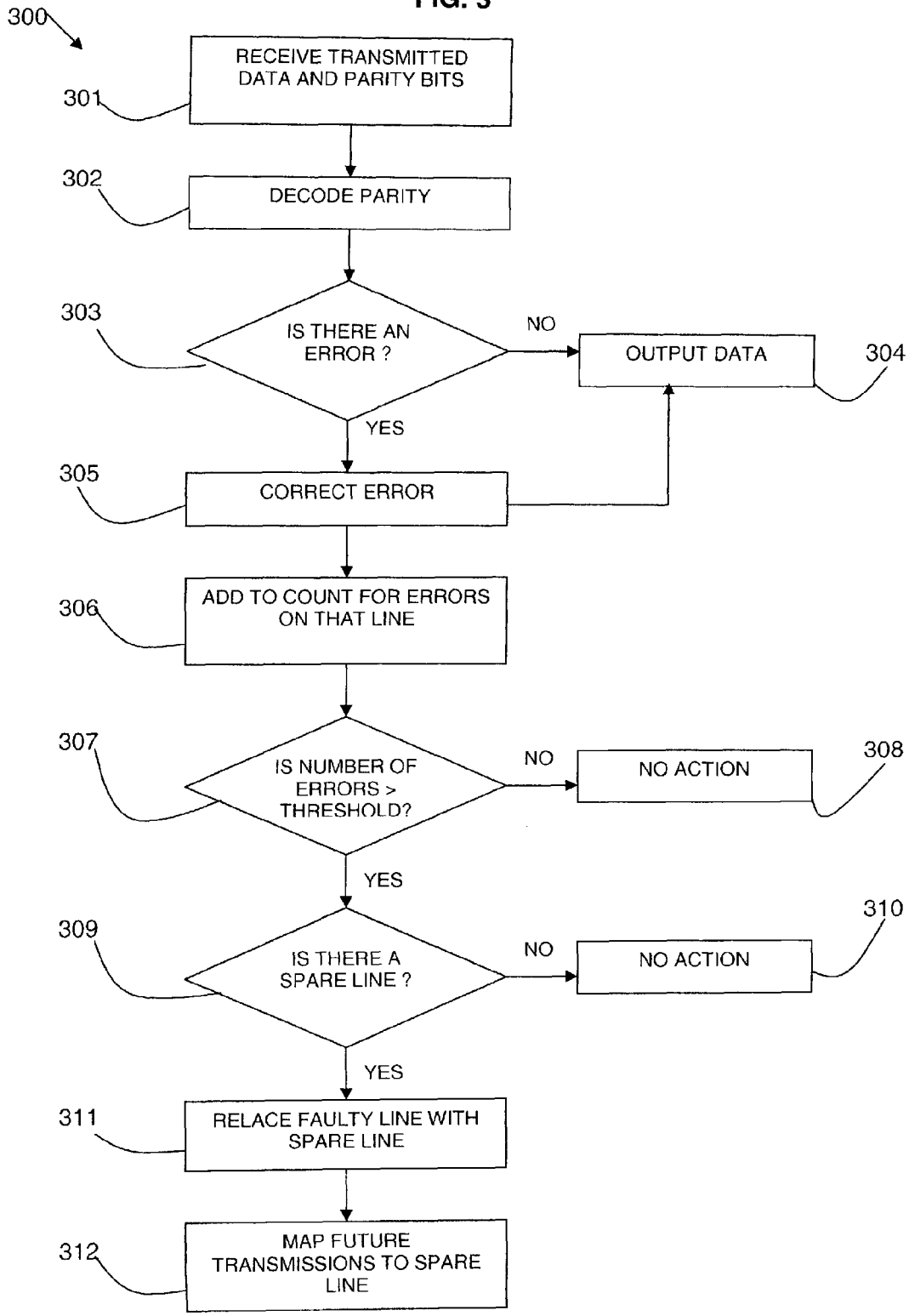

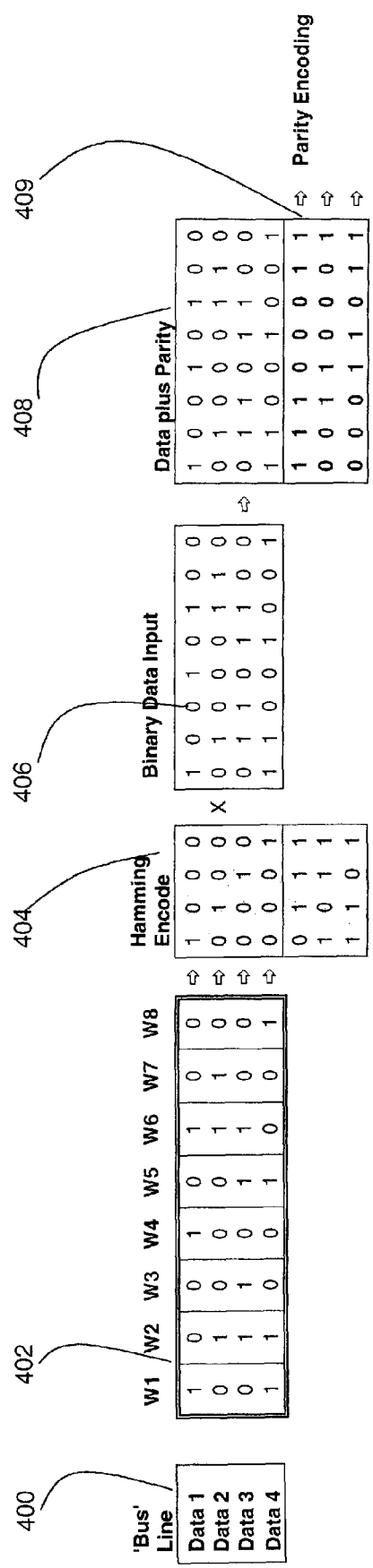

ERROR CORRECTION FOR DIGITAL SYSTEMS

CROSS REFERENCES TO RELATED APPLICATIONS

This application is related to GB Patent Application No. 0612892.0, filed Jun. 29, 2006.

FIELD OF THE INVENTION

This invention relates to the field of error correction for digital systems. In particular, it relates to error correction in parallel data connections at chip, package, card, or system level.

BACKGROUND OF THE INVENTION

Error correction has been explored to secure the integrity of digital information transmitted from one device to another. Known algorithms generally apply additional parity bits to message data bits in order to provide error detection and/or correction. Parity methods are known for detecting and correcting a single error bit in parallel data transfer. However, methods for detection and correction of double or multiple-bit errors tend to increase the number of data bits required substantially.

Memory errors appear for two reasons. One reason is a fault in the transport of the data from the memory to the data user and the other reason is an error in the memory itself. If the transport suffers a fault, the errors are likely to be repetitive on a particular line in parallel data connectors. However, errors in the memory itself are likely to be non-repetitive and spread across different lines.

(Error-Correcting Codes) are designed to correct unpredictable non-repetitive errors, with each set of bits being seen as new and corrected appropriately. However, errors also occur which are repetitive errors where one line of a parallel interconnect is in error. Where data is moved over a parallel bus, there is a significant chance of repetitive errors on the same line of the bus.

Hamming codes are error-correcting codes that can detect and correct single, double, or multiple-bit errors depending on the number of parity bits used. Hamming codes are described in Hamming, R. W., "Error Detecting and Correcting Codes", Bell System Technical Journal, 29, 147-160 (1950). Pure Rectangular or Triangular codes based on variants of the Hamming solution require large numbers of additional parity bits to encode redundancy into an interface.

JTAG (Joint Test Action Group) scanning tests printed circuit boards using a boundary scan. It provides fault detection and not correction on chip interfaces. This also requires systems to enter a specific test state to run the scan.

SUMMARY OF THE INVENTION

It is an aim of the invention to improve the efficiency of sequential multiple-bit error correction. It is most suitable for situations where gradual degradation is the dominant mechanism, rather than simultaneous burst errors across multiple data bits. Another application is in situations where the manufacturing yield or performance of individual components is low, for example, due to interconnect problems.

It is a further aim of the invention to protect against gradual degradation of data lines and communication paths such as are frequently employed in chip-to-chip or system-to-system communications buses. Examples include oxidising connector contacts, chip-bonding problems and mechanical damage to connectors or cables.

According to a first aspect of the present invention there is provided a method for error correction across multiple parallel lines, comprising: receiving data bits and parity bits across parallel lines; performing error detection and location to identify one or more faulty lines; disabling a faulty line and enabling a spare line; re-routing data from the faulty line to the spare line; and mapping parity for subsequent error detection.

Preferably, the method includes correcting the data on a faulty line and outputting the corrected data. The method may also include tracking line errors and disabling a faulty line after a predetermined number of errors in a given period. A faulty line may be a line transmitting data bits or parity bits.

Carrying out error detection may use a single-bit error correction algorithm, a double-bit error correction algorithm, or a multiple-bit error correction algorithm, with the associated required number of parity bits.

The method may be repeated to detect and re-route sequential multiple-bit line errors using additional spare lines. If there are no more spare lines, the method may correct the data on the faulty line.

The error detection may apply Hamming error correction or any other suitable parity error correction method.

According to a second aspect of the present invention there is provided a computer program product stored on a computer readable storage medium, comprising computer readable program code means for performing the steps of receiving data bits and parity bits across parallel lines; carrying out error detection and location to identify one or more faulty lines; disabling a faulty line and enabling a spare line; re-routing data from the faulty line to the spare line; and mapping parity for subsequent error detection.

According to a third aspect of the present invention there is provided an interface system between a source component and a destination component, comprising: multiple parallel lines for transmitting data or parity bits; one or more spare lines; an error detection means for identifying one or more faulty lines; a mapping means for re-routing data or parity from a faulty line to a spare line; and a communication link for communicating the re-routing between the source component and the destination component.

The data bits may include signal, control, clock, status, and address information.

The parallel lines may be provided in one or more parallel bus or they may be independent interconnections on separate lines. The parallel lines may alternatively be a combination of one or more parallel buses and one or more independent interconnections.

The error detection means may include a correction means for correcting the data on a faulty line and outputting the corrected data.

The interface system may include means for tracking line errors and disabling a faulty line after a predetermined number of errors in a given period. A faulty line may be a line transmitting data bits or parity bits.

The communication link may be independent of the parallel lines. The communication link may be protected in the form of an interface system as defined in the third aspect of the invention.

The present invention may be used in any environment in which data is transferred across parallel lines between the same source and destination components. For example, this may be in the form of a parallel bus; multiple parallel buses;

a combination of a parallel bus and other lines, including serial lines; multiple serial lines; multiple single interconnects; etc.

A key of this invention is the combination of existing mathematical methods for error correction together with additional spare capacity on an interface, further combined with system-level intelligence and processing to reconfigure faulty elements. Sequential multiple-bit error correction may be achieved with minimal increase in pin-count over single-bit error correction methods. In addition, simultaneous multiple-bit error correction can be used sequentially with multiple spare line capacity.

Additional complexity is added to the system in a modular manner. The modules are scaleable and take advantage of present modular design philosophies together with cheap silicon. Design and implementation costs may be minimal and incorporated into a standard product range with no functional dependency on enabled devices at the other end of the communications bus.

BRIEF DESCRIPTION OF THE DRAWINGS

Embodiments of the present invention will now be described, by way of examples only, with reference to the accompanying drawings in which:

FIG. 3 is a flow diagram of a method in accordance with the present invention; and FIGS. 4A and 4B are schematic diagrams showing error correction in accordance with the present invention.

DETAILED DESCRIPTION

Figure 1:
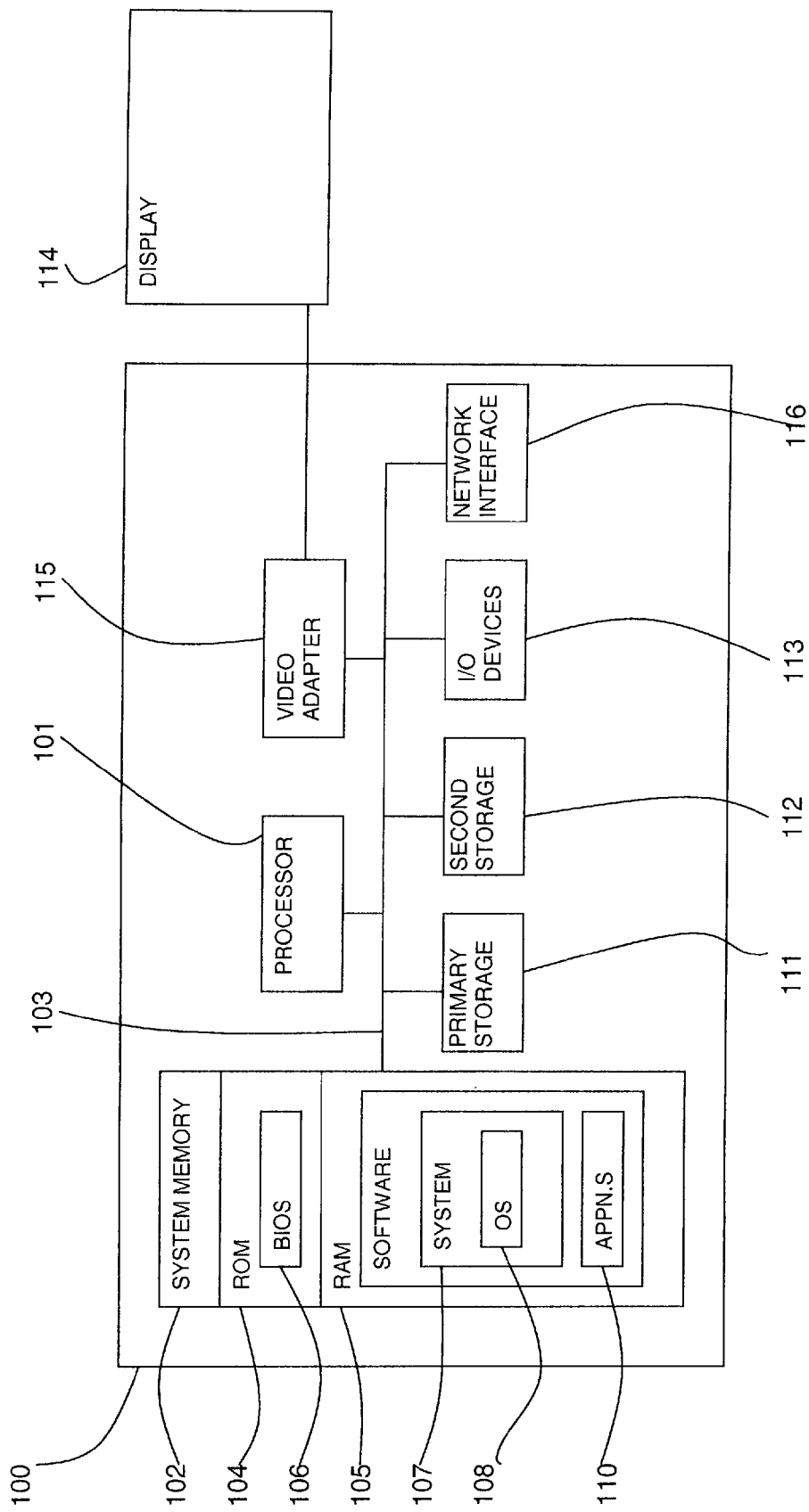
FIG. 1 is a block diagram of a known computer system in which the present invention may be used.

Referring to FIG. 1, a known data processing system 100 is shown in which the described error correction may be used in multiple different contexts. The data processing system 100 is suitable for storing and/or executing program code including at least one processor 101 coupled directly or indirectly to memory elements through a bus system 103. The memory elements can include local memory employed during actual execution of the program code, bulk storage, and cache memories which provide temporary storage of at least some program code in order to reduce the number of times code must be retrieved from bulk storage during execution.

The memory elements may include system memory 102 in the form of read only memory (ROM) 104 and random access memory (RAM) 105. A basic input/output system (BIOS) 106 may be stored in ROM 104. System software 107 may be stored in RAM 105 including operating system software 108. Software applications 110 may also be stored in RAM 105.

The system 100 may also include primary storage element 111, such as a magnetic hard disk drive and secondary storage element 112, such as a magnetic disc drive and an optical disc drive. The drives and their associated computer-readable media provide non-volatile storage of computer-executable instructions, data structures, program modules and other data for system 100. Software applications may be stored on primary and secondary storage elements 111, 112 as well as system memory 102.

The computing system 100 may operate in a networked environment using logical connections to one or more remote computers via a network adapter 116.

Input/output devices 113 can be coupled to the system either directly or through intervening I/O controllers. A user may enter commands and information into the system 100 through input devices such as a keyboard, pointing device, or other input devices (for example, microphone, joy stick, game pad, satellite dish, scanner, or the like). Output devices may include speakers, printers, etc. A display device 114 is also connected to system bus 103 via an interface, such as video adapter 115.

The present invention relates to error correction on parallel data transfer lines which may be implemented in many different areas in a data processing system 100 as illustrated in FIG. 1. The error correction may be applied at many different levels including chip-to-chip interconnects, chip interfaces, system-to-system buses, etc.

The error correction may be employed at a component level in memory chips affixed to RAM 105 or ROM 104, or in processing chips associated with other elements of a system such as processors, memory management, primary storage, secondary storage, I/O devices, video controller, etc. Components within each element may use the error correction in their connection to the circuit card or cards associated with the element.

Additionally, the error correction may be employed for interface connections, for example, between I/O controllers and devices. The error correction may also be employed at a system level in the interface between each of the elements of system 100 and their common interconnecting bus 103.

Figure 2A:
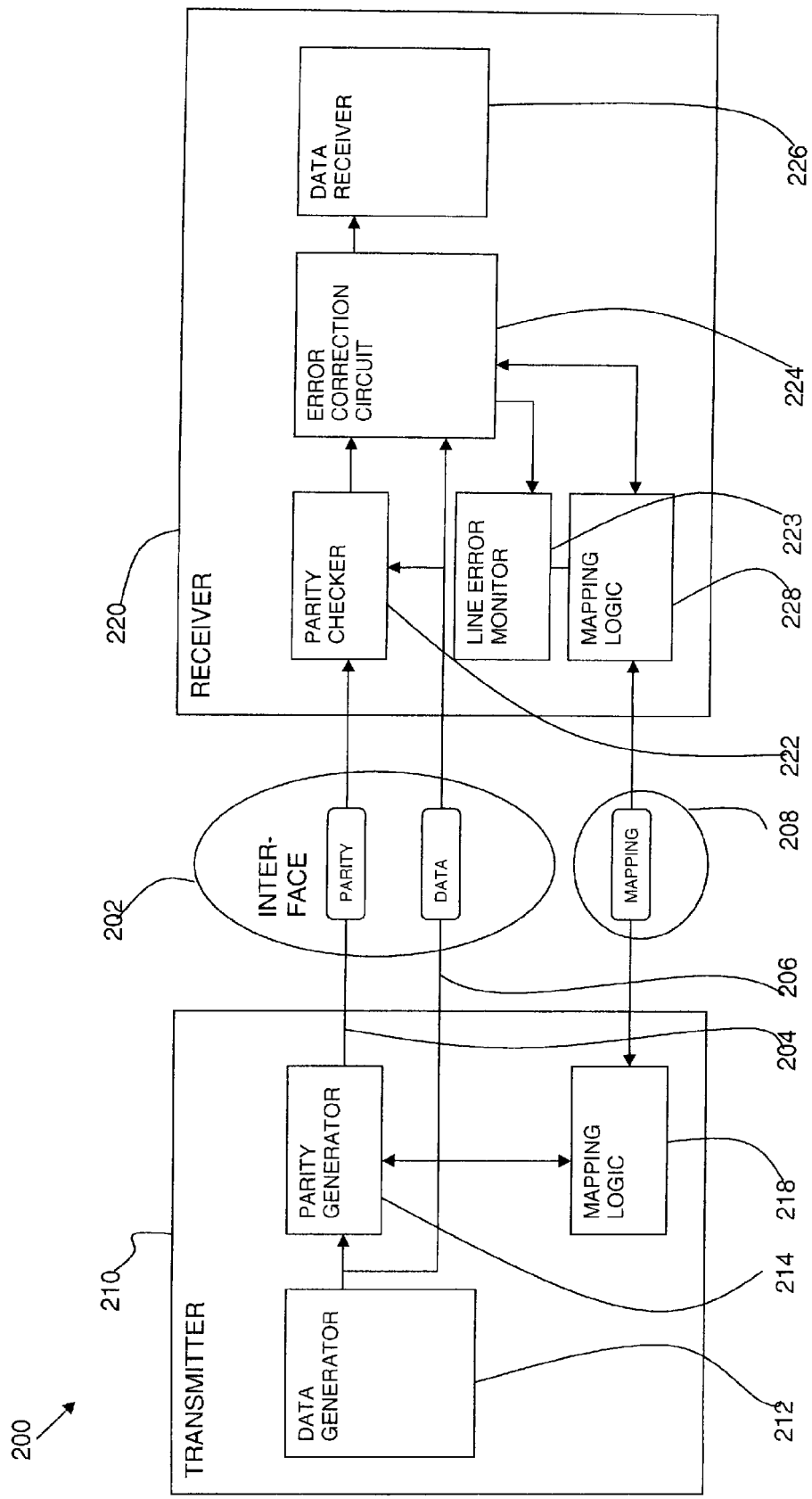
FIGS. 2A and 2B are block diagrams of a system in accordance with the present invention.

Referring to FIG. 2A, a block diagram shows system 200 illustrating the components of the described error correction system. A transmitter or source component 210 generates the data to be transferred across interface 202 formed of parallel lines to receiver or destination component 220.

Transmitter component 210 includes data generator 212 which generates the data to be transferred. The data is sent directly 206 over the interface 202. The data is also sent to parity generator 214, which generates parity bits that are also sent 205 across interface 202.

Parity checker 222 at the receiver component 220 combines the received parity with the received data to generate check bits. The check bits are all zero if the received parity corresponds to the received data. If an error has occurred in transmission of the data or the parity across the interface 202, one or more of the check bits will be non-zero. An error correction circuit 224 combines the check bits with the received data to correct the error in the data. The corrected data is then passed on to the data receiver 226.

The described system 200 includes one or more spare lines in interface 202, which may be used to replace an interface line if a persistent error is located on the line. The described system also has mapping logic 218, 228 at transmitter component 210 and receiver component 220 with communication means 208 for communicating the mapping logic to establish which spare lines of interface 202 are used to replace interface lines.

Line status monitor 223 monitors the error status of the lines and counts the number of errors on a given line. For example, this may be monitored within a pre-set number of clock cycles. When a predefined threshold number of errors on a line is reached, line status monitor 223 instructs mapping logic 228 to replace the error-prone line with a spare line.

This provides a dynamic means of reconfiguring both the transmitter and receiver components to extend the error detection and correction. Single-bit error correction may be used in which case a single line error is identified and recorded by the line status monitor 223 at each transfer. Alternatively double or multiple error correction may be used (with the required additional number of parity bits) in which case double or multiple lines in error are recorded by the line status monitor 223 at each transfer.

Figure 2B:
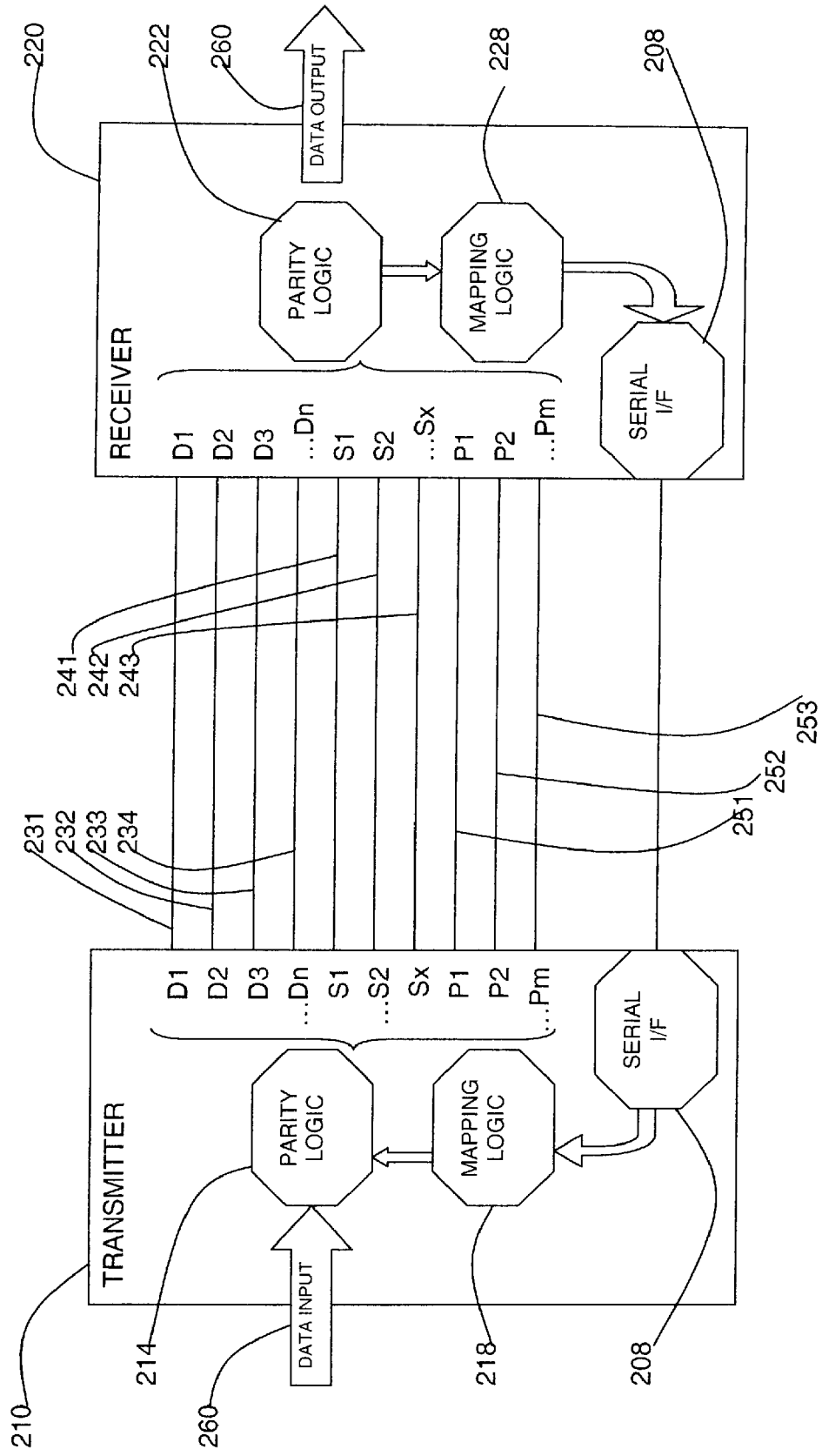

Referring to FIG. 2B, a schematic diagram provides further details of the system 200. The interface 202 between the transmitter component 210 and the receiver component 220 includes a plurality of parallel lines.

The interface 202 may be a parallel bus, but may also be multiple parallel independent interconnections on separate lines. The parallel lines may take many different forms. In one embodiment, the parallel lines may be provided by one or more parallel buses in which each parallel bus includes parallel lines across which data bits are transmitted. In another embodiment, the parallel lines may be a plurality of serial lines or a combination of serial lines and parallel bus. In another embodiment, the parallel lines may be chip interconnects. The parallel lines may transmit signal, control and status data, address data, as well as data itself.

FIG. 2B shows n data lines 231-234, x spare lines 241-243, and m parity lines 251-253, where n and m depend on the parity algorithm used. The redundancy implementation of interface 202 determines x, the number of spare lines 241-243.

Data input 260 is encoded by parity logic 214 integral to transmitter component 210 and transmitted. Parity logic 222 of receiver component 210 decodes the parity associated with the data bits and identifies which signal line or lines need to be corrected if one or more errors are detected depending on the number of error bit correction algorithm used. Data output 262 from this section includes the compensated data for direct use by the remainder of the system and also identifies which line or lines contain a fault.

Mapping logic 218, 228 determines which lines are to be encoded with parity and which lines will transmit the parity based upon fault identification by parity logic 222. A hard fault will result in a line being disabled. A soft fault may not require any further action unless the problem persists.

Serial link 208 communicates the error status as seen by receiver component 220 back to transmitter component 210 and ensures that both components 210, 220 communicate across the same data lines and parity lines using mapping logic 218, 228. The data link may be a bi-directional serial link; however, other forms of communication are also possible. This signal path requires no dependency upon the data or parity bits of protected interface 202. Separate link 208 may itself be protected using similar and independent methods of parity and spare lines. Redundancy on the serial bus has been omitted to illustrate the main operation more clearly.

A single bit error correction is used to detect and correct an error in one line at each data transfer. Multiple-bit error correction is used to detect and correct multiple errors simultaneously in different lines at each data transfer. In either case, if the error persists on the same line for a predetermined period, the line is replaced by one of the spare lines. If a further error is detected and persists in another line, another spare line is used. This continues until all the x spare lines have been used to replace the x faulty lines. The error correction can still detect and correct another error in a line resulting in x+1 errors being corrected; however, there are no more spare lines to replace this faulty line.

In this way, multiple sequential errors in can be detected and corrected. The number of spare lines 241-243 determines how many errors can be corrected. The principle behind this system is to combine multiple-bit error correction with spare capacity designed into the interface. Efficiencies increase greatly with increasing bus size and with the number of errors to be corrected.

Referring to FIG. 3 a flow diagram 300 shows the described method. The transmitted data and parity bits are received 301 at the destination. The parity is decoded 302 and it is determined if there is an error 303. If there is no error, the data is output from the receiving component 304.

If an error is detected, the error is corrected 305 by inverting the bit and the corrected data is output from the receiving component 304. The line in which the error occurred is noted and a count is incremented for errors on that line 306. If errors in multiple lines are noted due to the use of multiple-bit error correction, the count is incremented for errors on each of the lines identified.

Step 307 determines whether the number of errors on a line is greater than a threshold number in a given time period. If not, then no action is taken 308. However, if the threshold is exceeded, step 309 determines whether a spare line is available. If not, then no action is taken 310. However, if a spare line is available, the faulty line is logically replaced with spare line 311. All further transmissions map the data of the faulty line to spare line 312.

The described method and system may be used without error correction, such that the lines in error are identified and replaced with a spare line if an error persists without outputting corrected data.

An example embodiment is now described in which Hamming single-bit error correction code is used. Any algorithm supporting error detection, and optionally correction, may be used and Hamming correction is used as an example. A person skilled in the art would appreciate that other error detection and correction algorithms may be substituted.

FIG. 4A shows an encoding process with a bus line 400 having four data lines (D1-D4). Data words (W1-W8) 402 are transmitted across the bus line. A Hamming encoding matrix 404 is applied to the binary data input 406 corresponding to the data words 402. This produces a data plus parity matrix 408 with the parity bits 409 shown in bold.

Figure 4B:
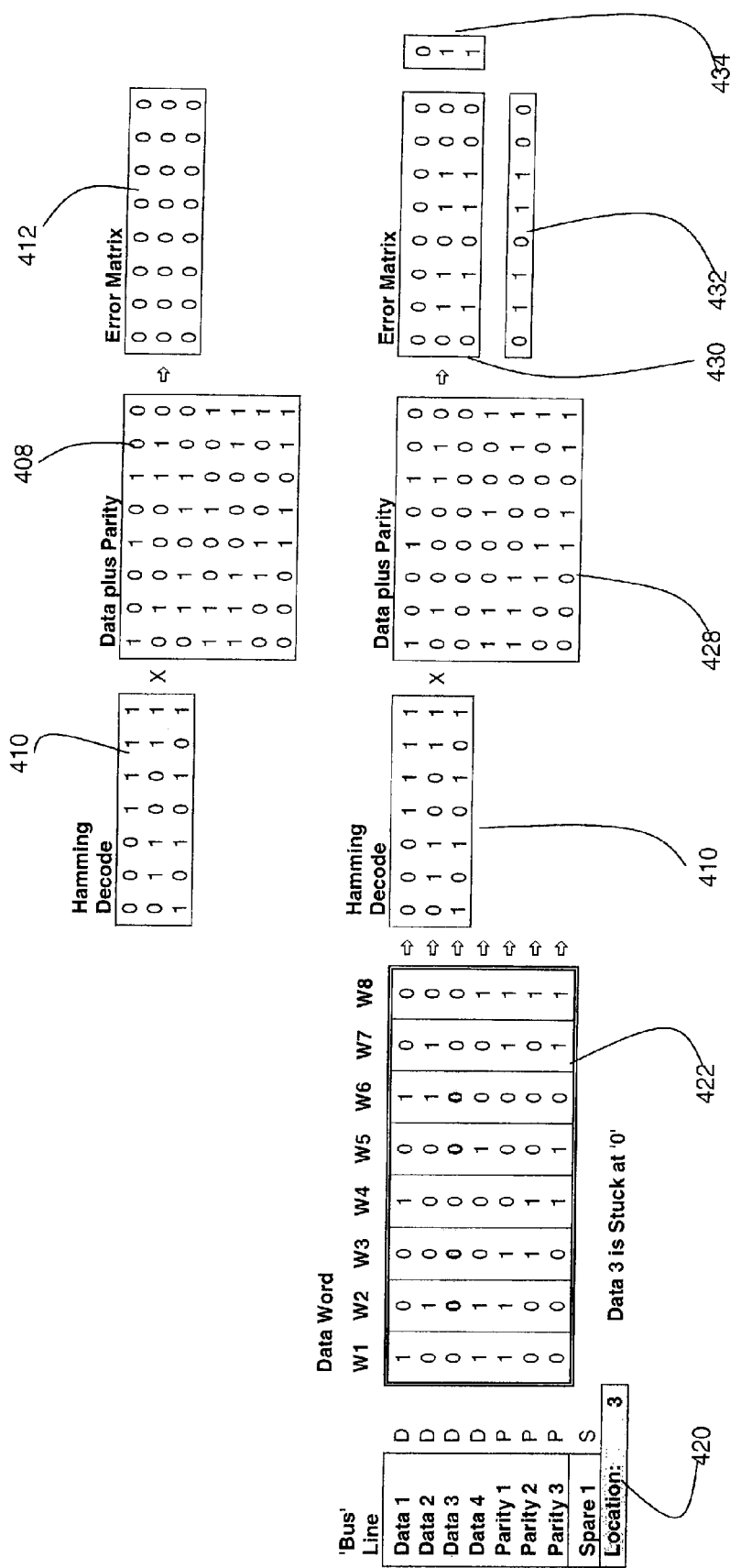

FIG. 4B shows a decoding process. A Hamming decoding matrix 410 is applied to the data plus parity matrix 408 to generate an error matrix 412. If the error matrix 412 contains all "0"s, then there is no error in the data plus parity matrix 408. However, if there is a single error in the transmission of the data or parity bits in the data plus parity matrix 408, the error matrix 412 will contain "1"s indicating the location of an error in a particular word/s and in which line within the word.

Bus line 420 is shown with four data lines (D1-D4), three parity lines (P1-P3) and a spare line (S1). Data words (W1-W8) 422 are encoded and transmitted across the bus line. In the illustrated example, there is an error in D3 which is stuck at "0". This results in an error in data words W2, W3, W5, W6 (shown as shaded in FIG. 4B). The illustrated error is in a data line; however, the error could equally be in a parity line.

Received data plus parity matrix 428 is decoded using Hamming decoding matrix 410 to produce error matrix 430. The error matrix 430 contains "1"s in the columns relating to words W2, W3, W5, W6. This is shown in row 432 for error detection in a given data word. A binary coding 434 is provided for the error location. In this example, the errors are all "0, 1, 1" indicating that the error is in D3. It can therefore be determined that there is an error in D3 in words W2, W3, W5, W6.

This error can be corrected by flipping the bits of these locations in the transmitted data. As the error is recurrent as it has occurred four times in eight data words, D3 is switched off and the data for this line is pushed to the spare line (S1).

If signal line D3 fails, the single-bit error correction logic (SBEC) will identify the line. If a persistent error is detected (e.g. a hard fault) then instead of correcting the error, the line is disabled. Spare line S1 is enabled, the signals are rerouted and parity is mapped to include the new S1 line instead of D3. The data lines, including S1, are now protected by the SBEC logic.

This sequence can continue until all of the spare lines have been exhausted, if there is more than one spare line, at which point the logic will default to correcting the error on the malfunctioning line. The number of errors corrected in this way is then a function of the number of spare lines.

The number of parity bits required for single-bit error correction (SBEC) is defined by the following Hamming equation where "n" is the total number of message bits and "m" is the number of parity bits:

$$n \leq 2^m - 1$$

The number of parity bits required for double-bit error detection and correction (DBEC) is defined by the following equation where "n" is the total number of message bits and "m" is the number of parity bits:

$$n(n+1)/2 \leq 2^m.$$

For example, 64-bit data bus would need 7 parity bits to encode for SBEC and 12 parity bits for DBEC. In contrast, only 7 parity bits and one spare bit are needed for the described method. The difference of four lines represents a considerable saving and complements existing technologies such as ECC for memory with the addition of only one spare line.

Figure 5:
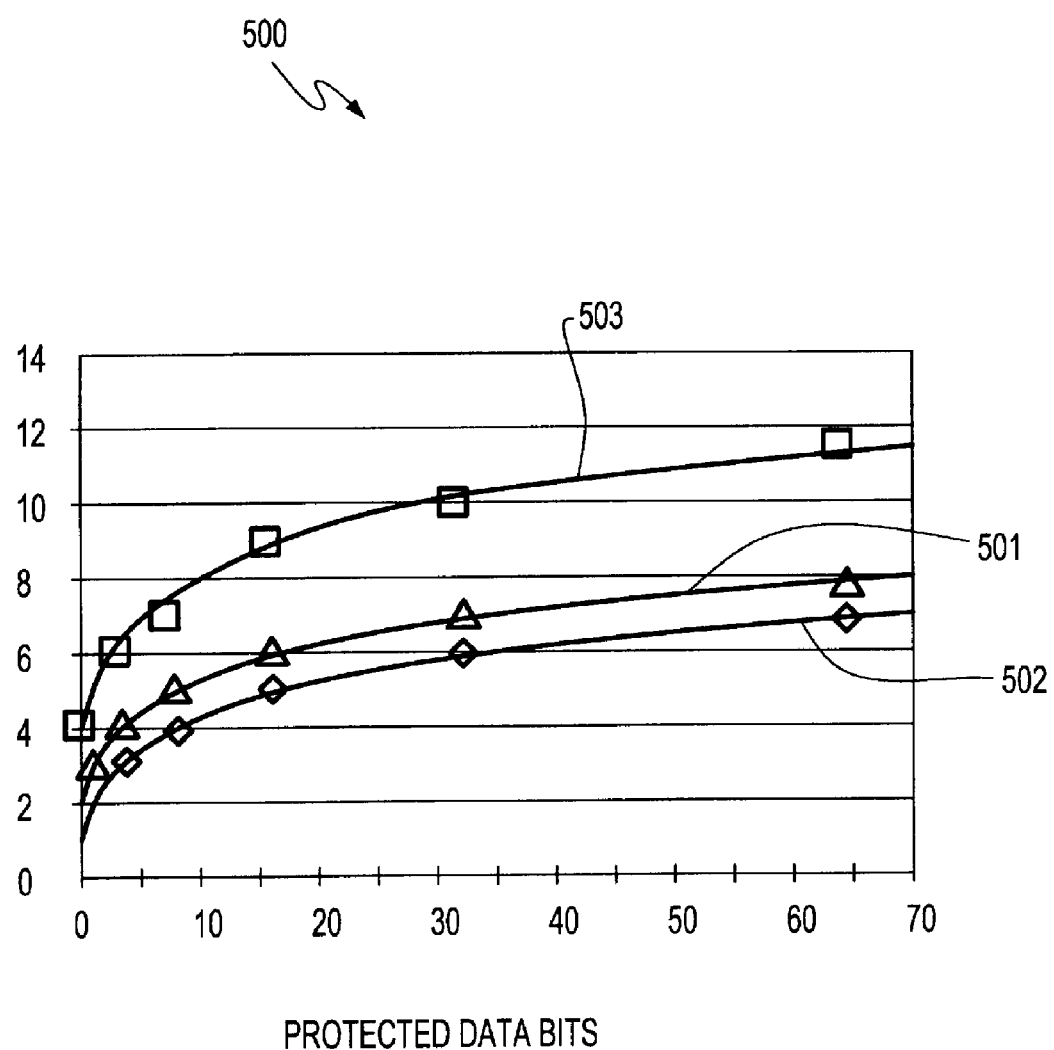
FIG. 5 is a graph showing a comparison of the number of parity bits required for the present invention with the prior art.

This is illustrated in FIG. 5 which is a graph 500 showing the overhead of the modified scheme 501 compared to the standard Hamming SBEC 502 and DBEC 503 methods. As will be seen, only one additional line is required to facilitate the parity although an additional line is also needed to facilitate chip-to-chip communications.

The modified algorithm used by the described system is an extension of an error correction method with key adaptive components to greatly improve efficiency. The described method and system provide an improvement in coding efficiency and hardware complexity over existing multiple-bit error correction methods.

The parallel lines to which the described method is applied may contain signal lines that are not generally considered to be part of a parallel bus. For example, if one of the lines is a control signal or serial interface and the other lines include a parallel data bus without a direct logical relationship to the first control signal then the lines can still be protected by this method although they do not form part of the same "bus".

The described method and system can also improve manufacturing yields significantly for silicon, IC packaging, PCB assemblies and systems in any electronic product containing two or more connected digital devices. Development times and time-to-market may also be reduced by improving system tolerance to marginal conditions and devices.

The invention can take the form of an entirely hardware embodiment, a software embodiment, or an embodiment containing both hardware and software elements. In a preferred embodiment, the invention is implemented in software, which includes but is not limited to firmware, resident software, microcode, etc.

The invention can take the form of a computer program product accessible from a computer-usable or computer-readable medium providing program code for use by or in connection with a computer or any instruction execution system. For the purposes of this description, a computer usable or computer readable medium can be any apparatus that can contain, store, communicate, propagate, or transport the program for use by or in connection with the instruction execution system, apparatus or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read only memory (ROM), a rigid magnetic disk and an optical disk. Current examples of optical disks include compact disk read only memory (CD-ROM), compact disk read/write (CD-R/W), and DVD.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for error correction across multiple parallel lines, comprising:
    receiving data bits and parity bits across parallel lines;
    performing error detection and location to identify one or more faulty lines;
    disabling a faulty line and enabling a spare line;
    re-routing data from the faulty line to the spare line;
    mapping parity for subsequent error detection;
    correcting the data on a faulty line and outputting the corrected data; and
    tracking line errors and disabling a faulty line after a pre-determined number of errors in a given time period.

2. The method according to claim 1, wherein error detection and location comprises a single-bit error correction algorithm, a double-bit error correction algorithm, or a multiple-bit error correction algorithm, with an associated required number of parity bits.

3. The method according to claim 2, wherein a faulty line can be a line transmitting data bits or parity bits.

4. The method according to claim 3, wherein an error detection step and subsequent re-routing of sequential multiple-bit line errors using additional spare lines is performed iteratively.

5. The method according to claim 4, wherein data on a faulty line is corrected if no more spare lines are available.

6. The method according to claim 5, wherein the error detection algorithm uses a Hamming code.

7. A computer program product stored on a computer readable storage medium, comprising computer readable program code means for performing the steps of:
    receiving data bits and parity bits across parallel lines;
    performing error detection and location to identify one or more faulty lines;
    disabling a faulty line and enabling a spare line;
    re-routing data from the faulty line to the spare line;
    mapping parity for subsequent error detection;
    correcting the data on a faulty line and outputting the corrected data; and
    tracking line errors and disabling a faulty line after a pre-determined number of errors in a given time period.

8. An interface system between a source component and a destination component, comprising:

multiple parallel lines for transmitting data bits or parity bits wherein the data bits comprise signal, control, clock, status, or address information;
one or more spare lines;
an error detection and location element for identifying one or more faulty lines;
a mapping logic element for re-routing data bits or parity bits from a faulty line to a spare line; and
a communication link for communicating the re-routing between the source component and the destination component.

9. The interface system according to claim 8, wherein the parallel lines comprise one or more parallel busses.

10. The interface system according to claim 8, wherein the parallel lines comprise independent interconnections on separate lines.

11. The interface system according to claim 8, wherein the parallel lines are a combination of one or more parallel buses and one or more independent interconnections.

12. The interface system according to claim 11, wherein the error detection and location element includes logic for correcting the data on a faulty line and outputting the corrected data.

13. The interface system according to claim 12, further comprising:
a history table for tracking line errors and control logic to disable a faulty line after a predetermined number of errors in a given period.

14. The interface system according to claim 13, wherein a faulty line comprises a line transmitting data bits or a line transmitting parity bits.

15. The interface system according to claim 14, wherein the communications link is a protected communication link incorporating the error detection and correction and redundancy techniques as recited in claim 8.

* * * * *